United States Patent [19]
Candy

[11] 3,932,864

[45] Jan. 13, 1976

[54] CIRCUIT FOR CONVERTING A COMPANDED DIGITAL TIME-AMPLITUDE PULSE CODE INTO A LINEAR DIGITAL AMPLITUDE PULSE CODE

[75] Inventor: James Charles Candy, Convent Station, N.J.

[73] Assignee: Bell Telephone Laboratories, Incorporated, Murray Hill, N.J.

[22] Filed: Jan. 6, 1975

[21] Appl. No.: 538,592

[52] U.S. Cl. ................................. 340/347 DD
[51] Int. Cl.² ................................. H03K 13/24
[58] Field of Search ....... 325/38 R, 38 B; 332/11 D; 340/347 DD, 347 AD; 235/154, 183, 152

[56] References Cited
OTHER PUBLICATIONS
Henry, "IBM Technical Disclosure Bulletin", Vol. 17, No. 3, Aug. 1974, pp. 909–910.

Primary Examiner—Charles D. Miller
Attorney, Agent, or Firm—C. S. Phelan

[57] ABSTRACT

A shift-companded, or $n{:}m$, pulse code, representing on a time-amplitude basis the information of a conventional, amplitude companded, pulse code, is converted to a linear, digital, amplitude, pulse code by first converting the shift-companded amplitude information into 2s-complement form with a number of bits sufficient to yield substantially the same resolution of the encoded information as did the shift-companded code form. Thereafter half of the 2s-complement code words are loaded into an accumulator to be averaged. The resulting digital word representing the average is in 2s-complement, linear PCM format and is thus readily useful for data processing or for further conversion to a commercial, companded, transmission code.

6 Claims, 5 Drawing Figures

FIG. 4

| | REGISTER 31 CONTENT n:m CODE (8 BIT) | QUANTIZED SIGNAL LEVELS ON LEAD 27 | AVERAGE OF ADJACENT VALUES | BINARY VALUE OF THE AVERAGE |
|---|---|---|---|---|
| SHIFT DIRECTION — LSB → TOWARD → MSB | 0 0 0 0 0 0 0 0 | 1/3 | 0 | 0 0 0 0 0 0 0 0 |
| | 0 0 0 0 0 0 0 1 | 1 2/3 | 1 | 0 0 0 0 0 0 0 1 |
| | 0 0 0 0 0 0 1 1 | 4 1/3 | 3 | 0 0 0 0 0 0 1 1 |
| | 0 0 0 0 0 1 1 1 | 9 2/3 | 7 | 0 0 0 0 0 1 1 1 |
| | 0 0 0 0 1 1 1 1 | 20 1/3 | 15 | 0 0 0 0 1 1 1 1 |
| | 0 0 0 1 1 1 1 1 | 41 2/3 | 31 | 0 0 0 1 1 1 1 1 |
| | 0 0 1 1 1 1 1 1 | 84 1/3 | 63 | 0 0 1 1 1 1 1 1 |
| | 0 1 1 1 1 1 1 1 | 169 2/3 | 127 | 0 1 1 1 1 1 1 1 |
| | 1 1 1 1 1 1 1 1 | 340 1/3 | 255 | 1 1 1 1 1 1 1 1 |

FIG. 5

| SEGMENT BOUNDARY | SIGN-MAGNITUDE BINARY CODE (9 BIT) | 2s-COMPLEMENT (13 BIT) |
|---|---|---|
| 255 | 1 1 1 1 1 1 1 1 | 0 0 0 0 1 1 1 1 1 1 1 1 1 |
| 127 | 1 0 1 1 1 1 1 1 | 0 0 0 0 0 1 1 1 1 1 1 1 1 |
| 63 | 1 0 0 1 1 1 1 1 | 0 0 0 0 0 0 1 1 1 1 1 1 1 |
| 31 | 1 0 0 0 1 1 1 1 | 0 0 0 0 0 0 0 1 1 1 1 1 1 |
| 15 | 1 0 0 0 0 1 1 1 | 0 0 0 0 0 0 0 0 1 1 1 1 1 |
| 7 | 1 0 0 0 0 0 1 1 | 0 0 0 0 0 0 0 0 0 1 1 1 1 |
| 3 | 1 0 0 0 0 0 0 1 | 0 0 0 0 0 0 0 0 0 0 1 1 1 |
| 1 | 1 0 0 0 0 0 0 0 | 0 0 0 0 0 0 0 0 0 0 0 1 1 |
| 0 { | 1 0 0 0 0 0 0 0 / 0 0 0 0 0 0 0 0 | 0 0 0 0 0 0 0 0 0 0 0 0 0 |
| -1 | 0 0 0 0 0 0 0 1 | 1 1 1 1 1 1 1 1 1 1 1 1 1 |
| -3 | 0 0 0 0 0 0 1 1 | 1 1 1 1 1 1 1 1 1 1 1 0 1 |
| -7 | 0 0 0 0 0 1 1 1 | 1 1 1 1 1 1 1 1 1 1 0 0 1 |
| -15 | 0 0 0 0 1 1 1 1 | 1 1 1 1 1 1 1 1 1 0 0 0 1 |
| -31 | 0 0 0 1 1 1 1 1 | 1 1 1 1 1 1 1 1 0 0 0 0 1 |
| -63 | 0 0 1 1 1 1 1 1 | 1 1 1 1 1 1 1 0 0 0 0 0 1 |
| -127 | 0 1 1 1 1 1 1 1 | 1 1 1 1 1 1 0 0 0 0 0 0 1 |
| -255 | 1 1 1 1 1 1 1 1 | 1 1 1 1 1 0 0 0 0 0 0 0 1 |

CIRCUIT FOR CONVERTING A COMPANDED DIGITAL TIME-AMPLITUDE PULSE CODE INTO A LINEAR DIGITAL AMPLITUDE PULSE CODE

BACKGROUND OF THE INVENTION

1. Field of the Invention

This invention relates to digital-to-digital code converters; and it relates, in particular to a circuit for converting a digital time-amplitude code to a digital amplitude code.

2. Description of the Prior Art

A copending application of R. C. Brainard and J. C. Candy, Ser. No. 461,878, filed Apr. 18, 1974, teaches an encoding and decoding technique in which information is represented in a time-amplitude format. That is, magnitude information is represented in part in a so-called shift-companded, or $n{:}m$, code format and in part in the values assumed in that format over recurrent intervals of time. In that format a word of $w$ bits includes $n$ most significant bit ZEROs followed in positions of decreasing binary significance by $m$ least significant bit ONEs. Thus, the designation $n{:}m$ code is hereinafter usually employed. This code format is conveniently generated by using a difference coded signal, such as delta-modulation type signal pulse train bits, to determine the direction of shifting of a shift register which is driven at the bit rate of the pulse train. The shift register is so wired that binary ONEs are injected in the least significant bit stage when the register shifts toward the most significant bit stage, and binary ZEROs are injected in the most significant bit stage when the register shifts toward the least significant bit stage — hence the concept of a shift-companded code.

Each word of the $n{:}m$ code represents a segment, or amplitude range, of a segmented, or linear piecewise approximation, pulse code such as a $\mu$-law companded digital pulse code. The Brainard et al. coder circuit parts which restore the $n{:}m$ code to analog form for feedback purposes are biased so that each code word actually represents an analog amplitude that is so chosen within the corresponding $\mu$-law code segment that the average value of any two successive $n{:}m$ code words is equal to the value, in terms of numbers of companded code unit-segment-sized amplitude units, of the intermediate $\mu$-law segment boundary. Thus, it should be apparent that an $n{:}m$ code word provides only a coarse amplitude representation. Greater resolution arises from the time dimension in the way that the code words are used. Each $n{:}m$ code word corresponds to a different bit time of the differential pulse code train; and it has been found that, if the reconstituted analog step information can be averaged over a Nyquist period of the underlying analog information, the average will be substantially equal to the average magnitude of the underlying analog signal sample magnitude in that same period. The use of the $n{:}m$ code thus greatly facilitates analog-to-digital and digital-to-analog conversions. However, that code is not convenient for direct utilization in commercial transmission systems which often employ digital words in a $\mu$-law companded code format. Similarly, the $n{:}m$ code is not convenient for data processing which often employs the linear 2s-complement pulse code modulation format.

Many digital-to-digital code converting techniques are known in the art for achieving conversion without first decoding the received signal to analog format prior to recoding it in the new digital format. The advantages of such digital conversions are well known. However, those prior techniques usually deal with amplitude-representative codes with one character per Nyquist interval for fully representing the signal amplitude during that interval. Such prior techniques are not useful for time-amplitude-representative codes such as the aforementioned $n{:}m$ code in which plural characters in a Nyquist interval each provides a coarse amplitude representation that is refined by considering as a group the characters of that time interval. Although there are known code conversion techniques for translating delta modulation signals to some other format by direct accumulation of the increment and decrement information in the delta modulation pulse train, these methods are unsuitable for the $n{:}m$ code in which each word is itself already an accumulation and not an increment. Furthermore, in the $n{:}m$ code, the code words are only a coarse representation of analog information, which representation does not directly accumulate accurately; whereas, the delta form is a fine-grained incremental representation which does directly accumulate accurately. In addition, the delta modulation form is usually a linear representation which can be conveniently accumulated and not $n{:}m$ companded form which cannot be conveniently directly accumulated.

SUMMARY OF THE INVENTION

The foregoing difficulties in converting $n{:}m$ code words to a form which is more compatible with codes for commercial transmission and processing systems are overcome in an illustrative embodiment of the invention in which $n{:}m$ code words are first converted to a 2s-complement format, then a selected half of those code words are chosen to perform a preliminary averaging operation to recover the values of intermediate PCM segment boundaries. Those boundary values are then averaged over recurrent Nyquist periods of the underlying analog information to yield linear 2s-complement PCM code words.

BRIEF DESCRIPTION OF THE DRAWING

A more complete understanding of the invention and various features, objects, and advantages thereof may be obtained from a consideration of the following detailed description in connection with the appended claims and the attached drawing in which:

FIG. 4 is a table illustrating correspondence among various numerical level representations associated with signal levels indicated in a shift register of a coder in FIG. 1; and FIG. 5 is a table illustrating the correspondence among $\mu$-law segment boundary levels, corresponding sign-magnitude representations of the same numbers as found in part in the aforementioned coder shift register, and corresponding 2s-complement representations of the same numbers.

DETAILED DESCRIPTION

Figure 1:
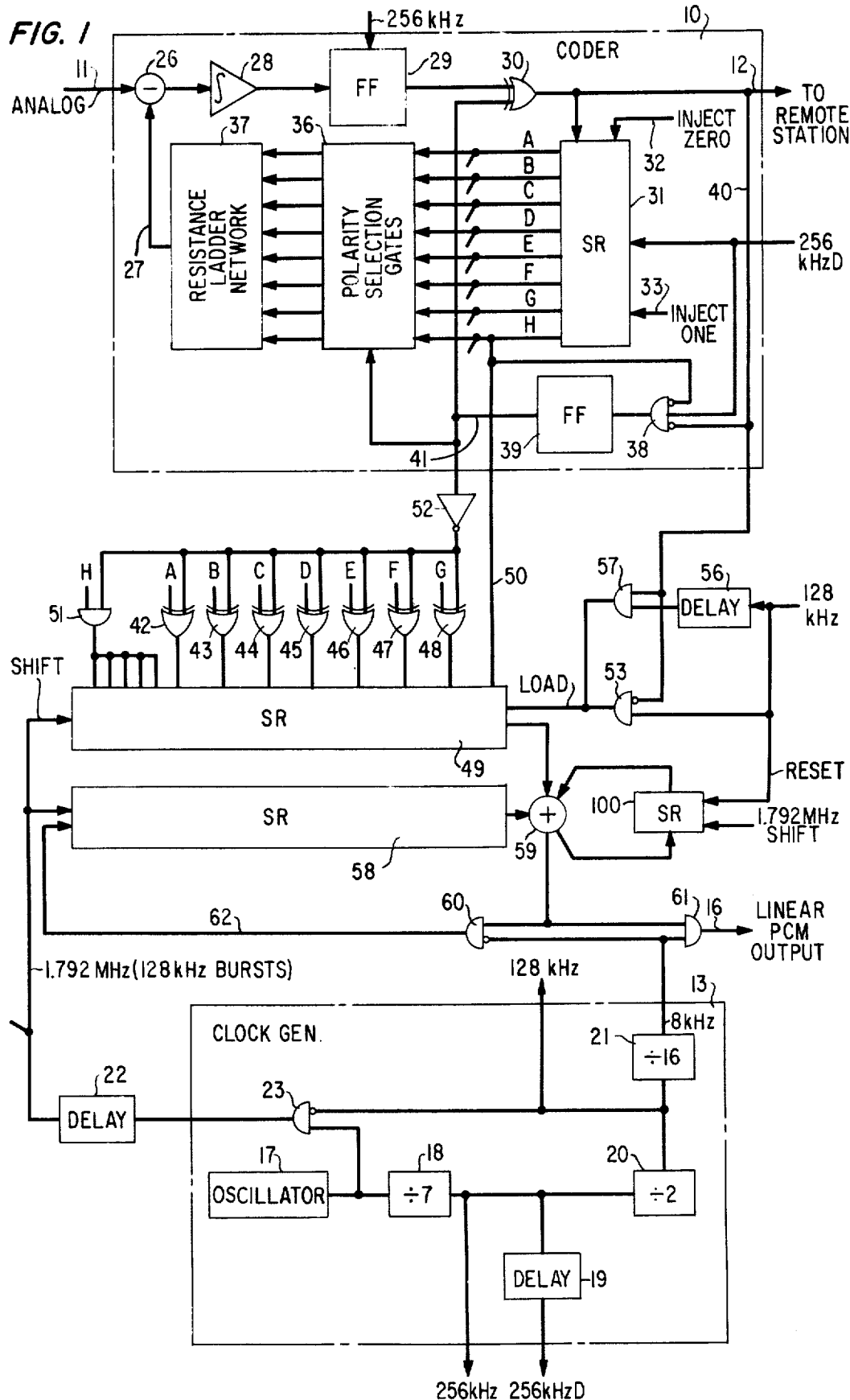
FIG. 1 is a diagram, partly in schematic form and partly in block and line form, of a code translator in accordance with the present invention.

In the diagram of FIG. 1 a coder 10, of the type disclosed in the aforementioned Brainard et al. application, receives analog signals on a lead 11 and produces corresponding differential pulse code in a bit serial train on a lead 12 which extends to a remote receiving station (not shown). The differential pulse code in this case is conceptually the same as a delta modulation pulse code train. However, the technique employed by the coder for producing that pulse train is quite different from the technique of the usual delta modulation coder, and this subject will be subsequently considered in greater detail. Also shown in FIG. 1 is a clock generator 13 which produces the clock signals, shown in FIG. 2, of the various frequencies and configurations required for operation of the coder 10 and of the remaining circuits in FIG. 1 which comprise the code translator of the present invention. That translator converts multibit, digital, pulse coded words from the coder 10 into a linear pulse code modulation (PCM) format on an output lead 16.

The clock generator 13 includes a clock pulse source which is advantageously an oscillator 17. In order to facilitate an understanding of the subsequent description of the present embodiment, the various clock signals provided by the clock generator 13 are designated by illustrative frequencies rather than the more typical reference characters. These frequency designations appear both on the clock generator output leads and on various clock input connections in FIG. 1 at which those clock frequencies are utilized.

Figures 2, 3:
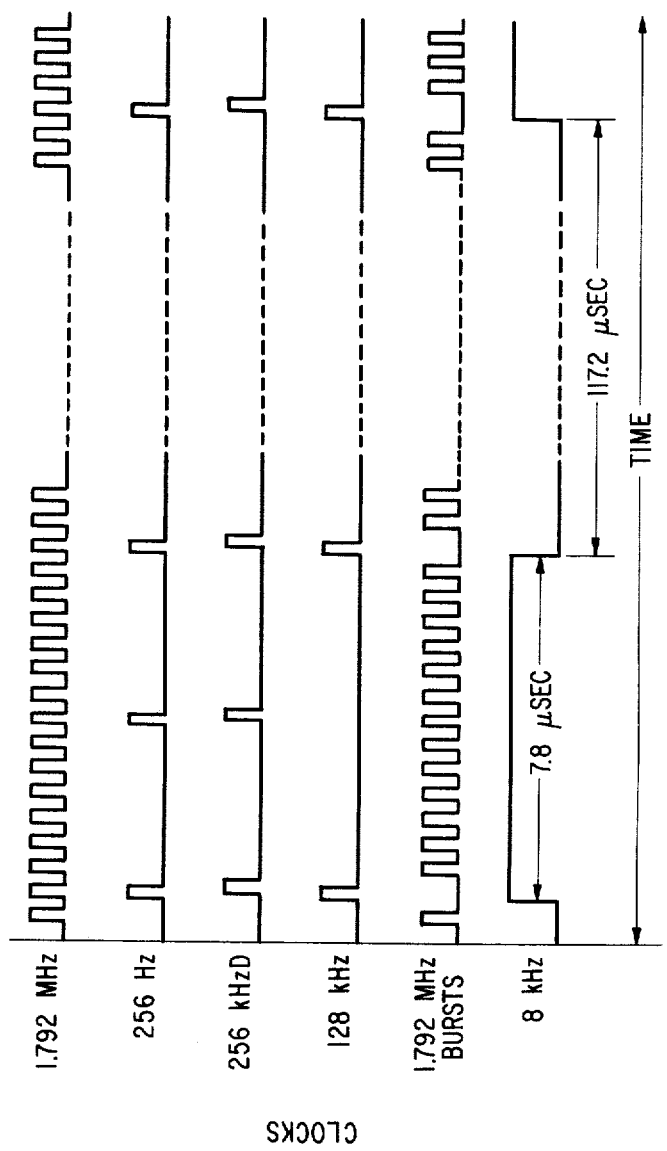
FIG. 2 is a timing diagram illustrating various clock waveforms utilized in the code translator of the present invention.
FIG. 3 is a diagram of illustrative relative signal levels on a $\mu$-law companded code scale.

The output of the oscillator 17 advantageously provides a signal at 1.792 MHz. This signal is reduced in frequency by a divide-by-seven frequency divider 18 to produce a 256 kHz clock signal which is thereafter delayed in a 50 nanosecond delay circuit 19 to produce a further signal at the same frequency designated 256 kHzD. A divide-by-two circuit 20 reduces the 256 kHz signal to a 128-kHz form which is still further divided down by a factor of 16 in a frequency divider 21 to produce an 8-kHz clock pulse train. The 1.792-MHz clock signal is used for actuating a coincidence gate 23 which is otherwise inhibited by each of the 128-kHz clock pulses. Thus, the output of gate 23 comprises the 1.792-MHz clock pulses appearing in 128-kHz bursts. The duration of each burst corresponds to the duration of the interval between the 128-kHz pulses. This signal is delayed by 150 nanoseconds in a delay circuit 22. Referring again to the 8-kHz clock signal, each pulse has an illustrative duration of 7.8 $\mu s$, which duration corresponds to 14 clock periods at the output of the oscillator 17. However, each burst includes only 13 pulses because the fourteenth is blocked by the 128 kHz inhibit on gate 23. Similarly, the interval between those 8-kHz clock pulses extends for 117.2 $\mu s$. All of the aforementioned clock signals are illustrated in FIG. 2 with respect to a common time scale so that the phase relationships among the various signals may be more easily observed. Respective vertical excursions in FIG. 2 represent the binary ONE signal amplitude.

Since the coder 10 is fully described in the aforementioned Brainard et al. application, it will be only briefly outlined here in order to facilitate an understanding of the time-amplitude code which is produced by the coder and which code is to be converted to linear PCM amplitude format. Thus, the analog input to coder 10 is coupled to a subtraction circuit 26 which produces an error signal that is indicative of the difference between the analog signal and a reconstituted analog signal sample, or step, obtained in a prior sampling interval and fed back by circuits including a feedback lead 27. The error signal is integrated by an integration circuit 28 and utilized to control the state of a bistable trigger circuit, such as the flip-flop circuit 29, which is periodically enabled at the coder sampling rate, i.e., 256 kHz. The output of flip-flop circuit 29 is complemented from time to time by an EXCLUSIVE OR gate 30 when the polarity of the digital information produced by the coder changes. Thus, the differentially coded pulse train in the output of gate 30 is coupled to the aforementioned output lead 12.

The same output on lead 12 is also employed to control the direction of operation of a shift register 31 which is supplied with shift clock pulses in the form of the 256-kHzD clock signal. When the register shifts downward (as illustrated) toward the least significant bit position thereof, binary ZEROs are injected at the top, most significant bit, stage of the register by a circuit schematically represented by a lead 32. Similarly, when the register shifts upward toward the most significant bit position thereof, binary ONEs are injected at the least significant bit stage. Bit parallel outputs A through H from the respective stages of the shift register 31 are coupled through polarity selection logic gates 36 and a resistance ladder network 37 to the feedback lead 27.

Polarity information is derived in digital form by a coincidence gate 38 which operates a toggle circuit, such as the bistable flip-flop circuit 39. Gate 38 is inhibited by each pulse in the coder output as coupled by way of a lead 40; and it is further inhibited by each binary ONE signal in the least significant bit position of the shift register 31, as provided by the H output lead of the shift register. In the absence of both inhibiting signals, the 256-kHzD clock signal operates the gate 38 to toggle the flip-flop circuit 39 and thereby produce the polarity signal for the coder. This signal is coupled by way of a lead 41 to operate both the EXCLUSIVE OR circuit 30 and the polarity selection logic gates 36.

As previously indicated the usual operation of the coder 10 produces in the shift register an $n:m$ code format with $n$ least significant bit ONES followed in increasing binary significance by $m$ ZEROs in the more significant bit positions. An identical code can also be produced at the aforementioned remote station by driving a shift register circuit flip-flop connected in a way similar to 31 and 39 and driven by the code transmitted on lead 12. The code format in the illustrated register 31 is converted to linear PCM in the manner hereinafter described.

At this point it is convenient to consider various numerical representations involved in the apparatus of FIG. 1. Thus, in FIG. 3 is shown a portion of the well known $\mu$-law companding interval scale. On this scale each of the segments extending between numbered segment boundaries 1, 3, 7, et cetera, extends for a signal amplitude range which is twice as large as the next lower, if any, segment range down to the zero segment boundary. The segment between the zero and one boundaries is herein also called a unit segment sized segment. Each segment has only 16 intervals of equal size within such segment. In the usual companded PCM code representation for commercial systems, the scale extends to ±255 unit-segment-sized units; and the code word has one sign bit, three bits to indicate the name of a segment boundary, and four bits for identifying the number of additional intervals within the next larger segment.

In FIG. 4 there is a table of signal magnitude representations in terms of the content of shift register 31 and illustrating how that content changes as the register shifts in one direction or the other. The first column contains the *n:m* code words actually included in the shift register. Circuits in the coder feedback for deriving a correspondingly stepped analog form for the digital representation in the shift register are biased so that the stepwise analog approximation has the analog, or quantized, signal level values indicated in the second column of FIG. 4. The bias is so chosen that those values are related to one another so that the average of any two adjacent ones of such values in the second column is equal to the value, in terms of numbers of unit-segment-sized units, of the intermediate $\mu$-law segment boundary as indicated in column 3 of FIG. 4. The binary representations of these latter segment boundary values are indicated in column 4 of FIG. 4.

The table in FIG. 5 illustrates the relationship among the $\mu$-law segment boundary values, in terms of numbers of amplitude units (first column); the 9-bit binary code for both sign and magnitude as shown in column 2 of FIG. 5; and the corresponding 2s-complement expression (third column) of the same values but in a 13-bit format. Notice that the magnitude part of the column 2 code is an *n:m* code. This is a fortunate property of $\mu$-law which will be exploited. The latter format, i.e., column 3, is capable of the same total resolution as the 9-bit magnitude format in column 2 plus the coder time information as will be described.

It has been found that the direct accumulation for averaging of the *n:m* coded digital information in shift register 31 does not yield an accurate result. The reason is that a digital word in register 31 does not represent in binary code the corresponding biased analog step value (column 2 in FIG. 4) that can be averaged to reconstruct the analog signal. However, the translating logic of FIG. 1 overcomes this problem.

Resuming consideration of the circuit in FIG. 1, the sign and *n:m* code, which we will call *s,n:m* code, information in the coder 10 is first converted to the 2s-complement form. For this purpose, the seven most significant bit outputs A through G of register 31 are each coupled to a single input of a different one of EXCLUSIVE OR gates 42 through 48. The eighth, or least significant, bit H of the information in register 31 is coupled by a lead 50 directly to an input of the least significant bit stage of a 13-stage shift register 49. The outputs of the EXCLUSIVE OR gates 42 through 48 are similarly coupled to successively more significant bit stages of shift register 49 in the same order that the corresponding signals A through H appeared in the shift register 31. In addition, the least significant bit H of the shift register 31 information is applied to an input of an AND gate 51; and the output of the latter gate is applied in multiple to inputs of the five most significant bit stages of the shift register 49.

The coder sign information on lead 41 in the output of flip-flop circuit 39 is also coupled through an inverter 52 for application in multiple to a second input connection of each of the EXCLUSIVE OR gates 42 through 48 as well as a second input to the AND gate 51. Thus, the 13 bit-parallel inputs just described for the shift register 49 constitute a 2s-complement format of the *s,n:m* information in coder 10. The 2s-complement sign bit is then at the most significant input to register 49. It has been found that by providing the AND logic function of the gate 51 the usual ambiguity introduced by positive and negative zeros (FIG. 5, column 2) in the signal representation is eliminated.

It was found, in addition, that it is desirable to expand the number of bits in the digital code to the mentioned 13-bit size in order to end up with a digitally coded word in the amplitude mode which has the same degree of resolution as does the 9-bit sign-magnitude information in the time-amplitude mode in coder 10. Referring once more to FIG. 3, the companded scale of one polarity from 0 to 255 has 16 intervals per segment, but those intervals are of different sizes in the different segments. A linear scale having the same smallest unit amplitude size as does the companded scale in FIG. 3, and covering the same total amplitude range, would have 4,080 levels; and that many levels can be represented with twelve bits of linear binary code. In order to embrace the bipolar possibility indicated in FIG. 3, an additional bit must be added for sign information with the result that a total of 8,160 levels on a linear scale can be represented. However, the signal format at the bit-parallel inputs to shift register 49, as shown in the third column of FIG. 5, contains in each word only the digital information derived from a single, corresponding, coarsely-representative word in coder 10. That is, a coded word at the input to shift register 49 represents only instantaneous magnitude information, and that word does not represent accurately the corresponding instantaneous analog step on lead 27 of coder 10. In addition, each such coded word does not include the associated information needed for fine resolution and which is contained in the time dimension of total information in coder 10. Two signal averaging steps of different types are utilized in order to extract that time dimension information conveniently and accurately.

The first of the two averaging steps involves translating the code words at the input to shift register 49 from mere segment indications into more precisely representative segment boundary indications. For this purpose, it has been found that by loading the register 49 at one-half of the coder shift register 31-word rate, and by selecting which words are loaded according to a certain rule, each loaded word will be the average of the current word being presented at the inputs of shift register 49 and the word which was skipped because of loading at the half rate of words in coder 10. The mentioned rule is that when shift register 31 is to shift down toward its least significant bit stage at a loading clock time, the register 49 must be loaded before the corresponding shifting operation takes place. However, if the shift register 31 is to shift upward toward its most significant bit stage at a loading clock time, shift register 49 must be loaded after that upward shifting operation. Stated differently, a word-pair averaging operation is carried out in which each word pair selected for averaging includes two successive words, neither of which was included in an immediately preceding pair unless the *n:m* code sequence represents a change in slope polarity. In the latter slope-change case, only one of the words of a selected pair need be different from the words of the preceding pair.

The operation of the foregoing rule can be confirmed by an examination of the table in FIG. 4. Thus, if the register 31 is initially in the condition representing the quantized signal level (Col. 2 in FIG. 4) one and two-thirds, and two shifts upward toward the most significant bit stage thereof are accomplished, the register 49 should be loaded by clock pulse information corresponding to the shift from the level four and one-third to the level nine and two-thirds. According to the mentioned rule, register 49 should be loaded after the latter shifting operation and will thus contain (omitting the five bits formed by the gate 51 output) the binary word 00000111, which is the binary representation of the numeral 7, which in turn is the average of the quantized levels four and one-third and nine and two-thirds. Similarly, in two successive down shifts from nine and two-thirds to one and two-thirds, the rule requires that register 49 be loaded before the final shift to the level one and two-thirds takes place. Consequently, register 49 is loaded with the binary character 00000011, which represents the numeral 3, which is the average of one and two-thirds and four and one-third. Similar results are produced for an up-down shift pair or a down-up shift pair.

Implementation of the aforementioned rule for the loading of shift register 49 is achieved in FIG. 1 by utilizing the 128-kHz clock for controlling the loading at one-half of the word rate of 256 kHz in coder 10. For this purpose, the 128-kHz clock is applied directly as an actuating input for an AND gate 53. The same clock signal is applied through a 100 nanosecond delay circuit 56 to actuate a further AND gate 57. The gate 57 receives as an enabling input the coder differential pulse code output from lead 40 in the coder, and the gate 53 receives the same lead 40 signals as an inhibiting input. Outputs of both gates 53 and 57 are supplied in parallel to a load-enabling input connection of the shift register 49. A pulse at that input enables all stages of the shift register to receive the bit-parallel signal input information from EXCLUSIVE OR gates 42 through 48, lead 50, and AND gate 51. When a pulse appears in the output of coder 10, it normally causes an upshift in shift register 31; and it enables gate 57 and inhibits gate 53. Thus, the 128-kHz clock is delayed in its application to the loading input of shift register 49 until after the corresponding shifting operation, initiated by the 256-kHzD clock signal, has taken place in shift register 31. However, if the coder output is in a no-pulse state, only gate 53 is enabled and the 128-kHz clock pulse loads shift register 49 in bit parallel slightly before the shifting in register 31 that is initiated by the 256-kHzD clock propagates new information to register 49. Thus, register 49 is loaded with the preshift information from register 31.

The 1.792-MHz clock bursts provide shift signals to the shift register 49 and to an additional accumulator shift register 58. These bursts shift the contents of register 49 serially to one input of bit-series full adder 59. The contents of the other shift register 58, which are initially zero, are simultaneously shifted in bit series to another input of the adder 59. A sum output of the adder 59 is fed to gates 60 and 61 in parallel, and an adder carry output is fed to a one-bit shift register 100. That register is clocked by the 1.792-MHz clock burst output of delay circuit 22. The output of register 100 is fed back to the adder carry input where it is added to the next input bits, which are more significant. At the end of 13 additions register 100 is set to zero by means of the 128 KHz pulse. This truncation of the final carry is necessary for correct addition of bipolar numbers in the 2s-complement format as is well known in the art. It can be seen from FIG. 2 that each of the mentioned shift pulse bursts lasts for a single output PCM word time, i.e., 7.8 μs; and the interval between bursts lasts for 117.2 μs, i.e., 15 word times. In this fashion, the output of adder 59 is applied to actuate an enabled one of AND gates 60 and 61 for steering the sum words from the adder either through a feedback lead 62 to a bit-series input of shift register 58 or to the output lead 16 for the code translator. The 8-kHz clock pulses inhibit gate 60 and enable the gate 61, and the same clock signal during the interval between pulses removes the inhibit from the gate 60. Thus, 15 sum words from adder 59 are recycled to the shift register 58. Each sixteenth sum word is produced during a 8-kHz pulse which inhibits the gate 60 and enables gate 61 so that such word is coupled to the output lead 16. At the same time, of course, register 58 is receiving shift pulses; but it is receiving no input data so that it finishes the word period with an all-ZERO content.

Thus, the 13-bit word on lead 16 represents the average of 16 words of the 2s-complement segment-boundary value words from shift register 49. This average contains both the magnitude information from shift register 31 in coder 10 and the fine time information represented by a group of 32 of such words. Since the linear PCM words provided to lead 16 are in 2s-complement form, they can be readily converted to companded PCM for application to commercial transmission systems or utilized directly in commercial data processing systems.

Although the present invention has been described in connection with a particular embodiment thereof, it is to be understood that other embodiments, modifications, and applications which will be obvious to those skilled in the art are included within the spirit and scope of the invention.

What is claimed is:

1. A pulse code translator for translating plural n:m coded, nultibit, pulse code words of a predetermined time-amplitude resolution into linear PCM code words each having a predetermined number of bits sufficient to have an amplitude resolution substantially the same as said predetermined time-amplitude resolution, said translator comprising means for averaging magnitude information represented by successive pairs of said n:m code words, and means for averaging a plurality w of successive words from said word-pair averaging means to produce a single linear PCM word.

2. The code translator in accordance with claim 1 in which said word-pair averaging means comprises means for converting each n:m code word to a 2s-complement format having said predetermined number of bits, means for storing pulse coded words, means for loading selected ones of said 2s-complement words into said storing means at a rate that is one-half the rate of production of words by said converting means, and means for coupling coded words from said storing means to said w-word averaging means.

3. The code translator in accordance with claim 2 in which said converting means comprises means for providing a binary signal indicating polarity of said n:m code words, means for directly coupling the least significant bit of each n:m word to be the least significant bit of the corresponding 2s-complement word, means for performing an EXCLUSIVE OR function with respect to the remaining more significant bits of each $n{:}m$ code word and said polarity signal to produce the $(n+m-1)$ next, after said least significant bit, most significant bits of the corresponding $2s$-complement word, and means for performing the AND logic function with respect to said $n{:}m$ code word least significant bit and said polarity signal to produce all remaining more significant bits of the corresponding $2s$-complement word.

4. The code translator in accordance with claim 2 in which means are provided for receiving a difference modulation signal pulse train corresponding in information content to said $n{:}m$ code words, and said loading means comprises first and second coincidence gates, means for applying said pulse train to said gates so that each pulse of said train enables said first gate and disables said second gate and the absence of a pulse enables said second gate and disables said first gate, means for applying clock pulses to actuate said second gate at said loading rate and to actuate said first gate at the same rate but delayed by a predetermined fraction of a period in said word production rate, and means for loading said converting means output words into said storing means in response to a coincidence-responsive output pulse from either of said gates.

5. The code translator in accordance with claim 1 in which said word-pair averaging means comprises a first shift register into which said magnitude information is loaded, and said $w$-word averaging means comprises, a second shift register of the same signal bit size as said first shift register, means for adding bit-series outputs of said shift registers together, means for recirculating a sum output of said adding means to a bit-series input of said second shift register during the addition of $(w\text{-}1)$ of said plurality of successive words, means for outputting said sum output during the one of said plurality of successive words following said $(w\text{-}1)$ words, and means for supplying bursts of shift pulses to said shift registers at a sufficient rate to achieve addition of a complete set of bits from said shift registers between successive loading operations of said first shift register.

6. A pulse code translator for translating a plurality of sequentially occurring, $n{:}m$ coded, multibit, pulse code words into a linear PCM code word representing the same underlying analog information as said plural $n{:}m$ code words, said translator comprising means for averaging magnitude information represented by successive words of selected pairs of said $n{:}m$ code words, each selected pair being two successive ones of such words neither of which was included in an immediately preceding selected pair unless the $n{:}m$ code sequence represents a change in slope polarity, in which case only one of the words of a selected pair was included in an immediately preceding selected pair, and means for averaging successive words from the first-mentioned averaging means to produce said PCM code word.

* * * * *